(12) United States Patent
Nakahara (10) Patent No.: US 8,242,809 B2
(45) Date of Patent: Aug. 14, 2012

(54) COMPARATOR CIRCUIT

(75) Inventor: Akihiro Nakahara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 246 days.

(21) Appl. No.: 12/656,454

(22) Filed: Jan. 29, 2010

(65) Prior Publication Data

US 2010/0207665 A1  Aug. 19, 2010

(30) Foreign Application Priority Data

Feb. 17, 2009  (JP) .................................. 2009-033671

(51) Int. Cl.
*H03K 5/153* (2006.01)
(52) U.S. Cl. .............................. 327/77; 327/78; 327/81
(58) Field of Classification Search .............. 327/77–81, 327/143
See application file for complete search history.

(56) References Cited

U.S. PATENT DOCUMENTS

| | | | |
|---|---|---|---|
| 5,834,954 A | 11/1998 | Tihanyi | |
| 2003/0227306 A1* | 12/2003 | Di Iorio | 327/143 |
| 2008/0084232 A1* | 4/2008 | Huang et al. | 327/77 |

FOREIGN PATENT DOCUMENTS

JP  9-46191 A  2/1997

* cited by examiner

*Primary Examiner* — Long Nguyen
(74) *Attorney, Agent, or Firm* — McGinn IP Law Group, PLLC (57) ABSTRACT

A comparator circuit, includes first and second terminals to which a reference voltage that determines a threshold voltage is inputted, a third terminal to which a standard voltage is inputted, a fourth terminal to which a target voltage that is to be detected and is based on the standard voltage is inputted, first and second transistors of a first conductivity type including control terminals connected to the first and second terminals, respectively, the first and second transistors flowing currents depending on a potential difference of the reference voltage, a third transistor of a second conductivity type connected in series with the first transistor, a fourth transistor of the second conductivity type connected in series with the second transistor, a fifth transistor of the second conductivity type through which a mirror current depending on a current flowing through the third transistor, a sixth transistor of the second conductivity type flowing a mirror current depending on a current flowing through the fourth transistor, a seventh transistor of the first conductivity type connected between the sixth transistor and the fourth terminal, and an eighth transistor of the first conductivity type connected between the fifth transistor and the third terminal, the eighth transistor flowing a mirror current depending on a current passing through the seventh transistor. A voltage depending on a voltage of an intermediate node between the fifth and eighth transistors is outputted as an output signal.

18 Claims, 7 Drawing Sheets

COMPARATOR CIRCUIT

INCORPORATION BY REFERENCE

This application is based upon and claims the benefit of priority from Japanese Patent Application No. 2009-33671 which was filed on Feb. 17, 2009, the disclosure of which is incorporated herein in its entirety by reference.

BACKGROUND OF THE INVENTION

1. Field of the Invention

The present invention relates to a comparator circuit.

2. Description of Related Art

Figure 7:
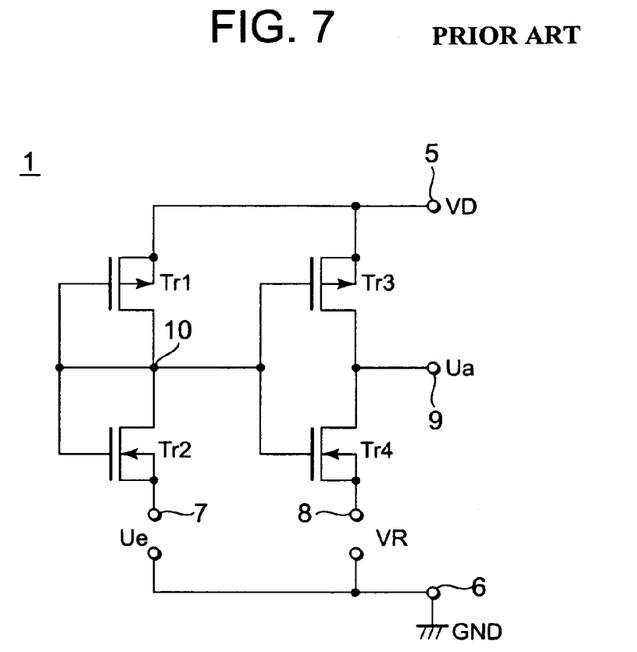
FIG. 7 is a diagram showing a configuration of a comparator circuit of a related art.

FIG. 7 shows a configuration of the comparator circuit 1 for detecting a minute voltage, which is described in Japanese Patent Application Laid Open No. Hei 9-46191. As shown in FIG. 7, the comparator circuit 1 includes PMOS transistors Tr1 and Tr3, and NMOS transistors Tr2 and Tr4. The PMOS transistor Tr1 and the NMOS transistor Tr2 are connected in series between terminals 5 and 7. The PMOS transistor Tr1 and the NMOS transistor Tr2 are connected to each other at a common node 10, and further, their respective gates are connected to the common node 10.

The PMOS transistor Tr3 and the NMOS transistor Tr4 are connected in series between the terminal 5 and a terminal 8. The PMOS transistor Tr3 and the NMOS transistor Tr4 are connected to each other by using a terminal 9 as a common node. The respective gates of the PMOS transistor Tr1 and the NMOS transistor Tr2 are connected to the common node 10.

The terminal 5 is applied with a positive potential VD of an operating voltage, and a terminal 6 is applied with a standard voltage GND. The terminal 8 is applied with a reference voltage VR. The reference voltage VR acts as a voltage to determine a switching threshold of the comparator circuit 1. A target voltage Ue to be detected is inputted across the terminals 7 and 6. The terminal 9 serves as an output terminal of the comparator circuit 1 to output an output voltage signal Ua.

SUMMARY

Such a comparator circuit 1 poses a problem as given below. The problem of being unable to ensure the output voltage signal with sufficiently large amplitude arises when a high voltage Ue is detected. This is due to the fact that the reference voltage VR is inputted to a current path that forms the terminal 9 as the output terminal, or equivalently, a current path formed of the PMOS transistor Tr3 and the NMOS transistor Tr4.

A comparator circuit of an exemplary aspect of the present invention, includes first and second terminals to which a reference voltage that determines a threshold voltage is inputted, a third terminal to which a standard voltage is inputted, a fourth terminal to which a target voltage that is to be detected and is based on the standard voltage is inputted, first and second transistors of a first conductivity type including control terminals connected to the first and second terminals, respectively, the first and second transistors flowing currents depending on a potential difference of the reference voltage, a third transistor of a second conductivity type connected in series with the first transistor, a fourth transistor of the second conductivity type connected in series with the second transistor, a fifth transistor of the second conductivity type through which a mirror current depending on a current flowing through the third transistor, a sixth transistor of the second conductivity type flowing a mirror current depending on a current flowing through the fourth transistor, a seventh transistor of the first conductivity type connected between the sixth transistor and the fourth terminal, and an eighth transistor of the first conductivity type connected between the fifth transistor and the third terminal, the eighth transistor flowing a mirror current depending on a current passing through the seventh transistor. A voltage depending on a voltage of an intermediate node between the fifth and eighth transistors is outputted as an output signal.

The comparator circuit according to the exemplary aspect of the present invention uses the reference voltage as a switching threshold so that an output signal generated at a node between the fourth and fifth transistors may vary in level to become high or low according to whether or not the target voltage to be detected exceeds the switching threshold. This eliminates the input of the reference voltage to a current path in which the output signal is generated.

According to the exemplary aspect of the present invention, the comparator circuit is capable of ensuring the output signal with sufficiently large amplitude, when a high voltage is detected.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS (First Exemplary Embodiment)

Figure 1:
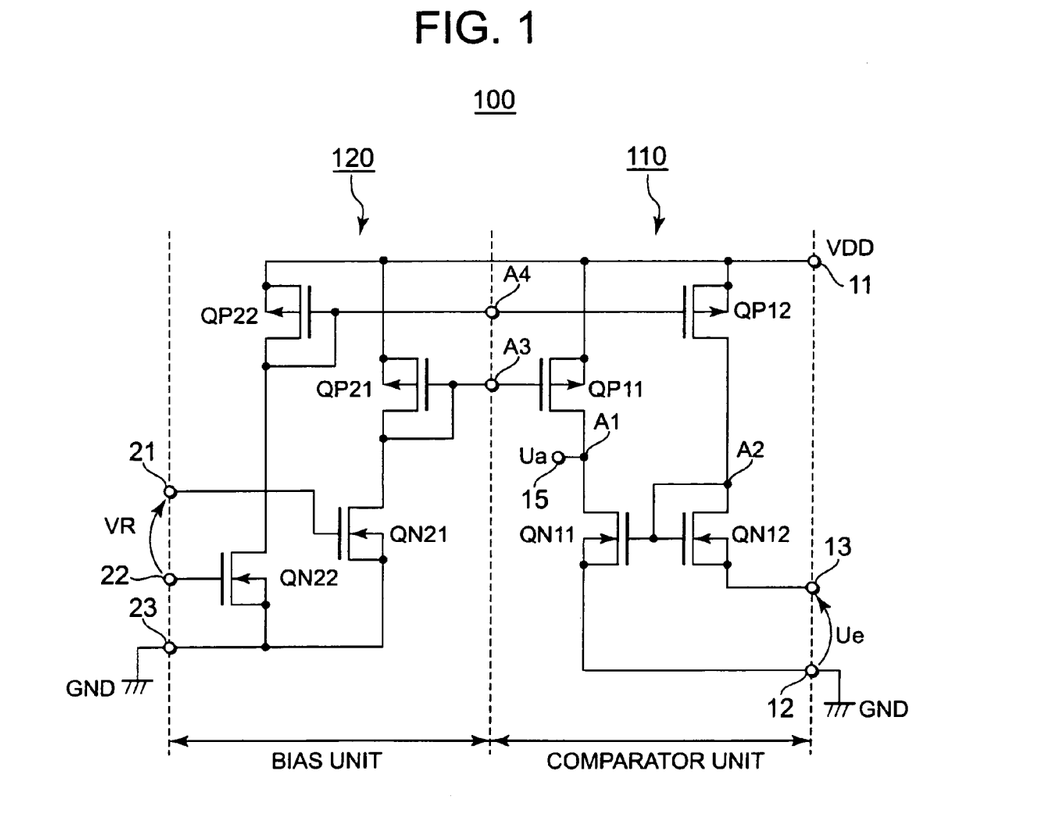
FIG. 1 is a diagram showing a configuration of a comparator circuit according to a first exemplary embodiment of the present invention.

FIG. 1 shows a configuration of a comparator circuit 100 according to a first exemplary embodiment. As shown in FIG. 1, the comparator circuit 100 includes a comparator unit 110 and a bias unit 120.

The comparator unit 110 includes PMOS transistors QP11 and QP12, and NMOS transistors QN11 and QN12. The PMOS transistor QP11 (fifth transistor) is connected at its source to a terminal 11 (fifth terminal), at its drain to a node A1, and at its gate to a node A3. The PMOS transistor QP12 (sixth transistor) is connected at its source to the terminal 11, at its drain to a node A2, and at its gate to a node A4. The NMOS transistor QN11 (eighth transistor) is connected at its drain to the node A1, at its source to a terminal 12 (third terminal), and at its gate to the node A2. The NMOS transistor QN12 (seventh transistor) is connected at its drain and gate to the node A2, and at its source to a terminal 13 (fourth terminal). Here, the NMOS transistors QN12 and QN11 form a current mirror with the NMOS transistor QN12 acting as an input transistor. The node A1 forms an output terminal 15 to output an output signal Ua. The terminal 11 is supplied with a positive potential VDD of an operating voltage, and the terminal 12 is supplied with a ground voltage GND. A voltage across the terminals 11 and 12 acts as a power supply voltage of the comparator circuit 100. The ground voltage GND supplied to the terminal 12 acts as a standard voltage of the comparator circuit 100. A target voltage Ue to be detected is inputted across the terminals 13 and 12.

The bias unit 120 includes PMOS transistors QP21 and QP22, and NMOS transistors QN21 and QN22. The PMOS transistor QP21 (third transistor) is connected at its source to the terminal 11, and at its drain and gate to the node A3. The PMOS transistor QP22 (fourth transistor) is connected at its source to the terminal 11, and at its drain and gate to the node A4. The NMOS transistor QN21 (first transistor) is connected at its drain to the node A3, at its source to a terminal 23, and at its gate to a terminal 21 (first terminal). The NMOS transistor QN22 (second transistor) is connected at its drain to the node A4, at its source to the terminal 23, and at its gate to a terminal 22 (second terminal). A reference voltage VR is inputted across the terminals 21 and 22.

Here, the nodes A3 and A4 act as connection nodes to provide connections between the comparator unit 110 and the bias unit 120. Further, the PMOS transistors QP12 and QP22 form a current mirror with the PMOS transistor QP22 acting as an input transistor. The PMOS transistors QP11 and QP21 form a current mirror with the PMOS transistor QP21 acting as an input transistor.

The PMOS transistors (QP11, QP12, QP21 and QP22) that form the comparator circuit 100 are identical in configuration such as transistor size. Further, the NMOS transistors (QN11, QN12, QN21 and QN22) are likewise identical in configuration such as transistor size. The PMOS transistors and the NMOS transistors are set for the following relationship: $\beta p(W_{QP}/L_{QP}) = \beta n(W_{QN}/L_{QN})$. Here, $W_{QP}/L_{QP}$ represents (the channel width of the PMOS transistor)/(the channel length thereof). $\beta p$ represents (the per-unit-area capacitance of a channel unit of the PMOS transistor)×(the mobility thereof). $W_{QN}/L_{QN}$ represents (the channel width of the NMOS transistor)/(the channel length thereof). $\beta n$ represents (the per-unit-area capacitance of a channel unit of the NMOS transistor)×(the mobility thereof).

Description will be given with regard to operation of the comparator circuit 100 configured as mentioned above. It will be here assumed that the PMOS transistors QP11, QP12, QP21 and QP22, and the NMOS transistors QN11, QN12, QN21 and QN22 are of the same transistor size. The reference voltage VR is inputted across the terminals 21 and 22 (the terminal 21 is on the high potential side). Thus, the NMOS transistors QN22 and QN21 are applied with gate-source voltages that differ by the reference voltage VR. The target voltage Ue to be detected is inputted to the terminal 13. Thus, the NMOS transistors QN11 and QN12 are applied with gate-source voltages that differ by the voltage Ue.

The PMOS transistor QP22 and the NMOS transistor QN22 are connected in series. The PMOS transistor QP22 has a current mirror connection to the PMOS transistor QP12. Further, the PMOS transistor QP12 and the NMOS transistor QN12 are connected in series. Thus, a current having the same current value as a current passing through the NMOS transistor QN22 passes through the NMOS transistor QN12. The NMOS transistor QN12 has a current mirror connection to the NMOS transistor QN11. Thereby, a current depending on the current passing through the NMOS transistor QN12 passes through the NMOS transistor QN11. However, the voltage Ue is applied to the source of the NMOS transistor QN12. Therefore, the potential of the node A12 also varies according to the voltage Ue. Thus, the current passing through the NMOS transistor QN11 connected at its gate to the node A12, of course, likewise varies according to the voltage Ue.

Then, the PMOS transistor QP21 and the NMOS transistor QN21 are connected in series. The PMOS transistor QP21 has a current mirror connection to the PMOS transistor QP11. Thus, a current having the same current value as a current passing through the NMOS transistor QN21 passes through the PMOS transistor QP11.

Here, if the voltage of an input signal Ue inputted to the terminals 13 and 12 of the comparator circuit 120 is equal to the reference voltage VR, then the current passing through the PMOS transistor QP11 becomes equal in current value to the current passing through the NMOS transistor QN11. When the current passing through the NMOS transistor QN11 is equal to the current passing through the PMOS transistor QP11, the comparator circuit 100 reaches a state of equilibrium. At this time, a voltage ½VDD of the node A1 is outputted as an inactive point of the comparator circuit 110, through the output terminal 15. Setting the reference voltage VR equal to 0.1 V, for example, leads to the comparator circuit 100 having a switching threshold of 0.1 V.

Then, the target voltage Ue to be detected (hereinafter called the input signal Ue) above the switching threshold causes the NMOS transistor QN12 to be more strongly non-conducting, which in turn raises the potential of the node A2. This renders the NMOS transistor QN11 conducting. Consequently, the potential of the node A1 drops, so that the output signal Ua at a low level is outputted to the output terminal 15.

Conversely, the input signal Ue below the switching threshold causes the NMOS transistor QN12 to be more strongly conducting, which in turn lowers the potential of the node A2. This renders the NMOS transistor QN11 non-conducting. Consequently, the potential of the node A1 rises, so that the output signal Ua at a high level is outputted to the output terminal 15.

As described above, the comparator circuit 100 according to the first exemplary embodiment employs a circuit configuration shown in FIG. 1 to set the reference voltage VR to a predetermined value and thereby determine the switching threshold according to the value of the reference voltage VR. Then, the PMOS transistors QP11 and QP12 or the NMOS transistors QN11 and QN12 included in the comparator circuit 100 are manufactured in the same size by the same manufacturing process. Thus, the PMOS transistors QP11 and QP12 or the NMOS transistors QN11 and QN12 have the same characteristics. Therefore, the comparator circuit 100 has high insensitivity to temperature characteristics and also invulnerable to fabrication variations. The comparator circuit 100 has a configuration such that the input signal Ue does not enter a current path that forms the output terminal, or equivalently, the current path formed of the PMOS transistor QP11 and the NMOS transistor QN11, as distinct from the conventional comparator circuit 1.

Here, the comparator circuit 1 shown in FIG. 7 is such that the reference voltage VR is inputted to the current path that forms the terminal 9 as the output terminal, or equivalently, the current path formed of the PMOS transistor Tr3 and the NMOS transistor Tr4. Due to this, the problem of being unable to ensure the output signal Ue with sufficiently large amplitude arises when a high voltage Ue is detected.

However, the comparator circuit 100 according to the first exemplary embodiment has a configuration such that the reference voltage VR is not inputted to the current path that forms the output terminal 14 (the node A1), or equivalently, the current path formed of the PMOS transistor QP11 and the NMOS transistor QN11. Thus, the comparator circuit 100 is capable of ensuring the output signal Ua with sufficiently large amplitude when a high voltage Ue is detected, while having high insensitivity to the temperature characteristics and high invulnerability to the fabrication variations.

(Second Exemplary Embodiment)

Figure 2:
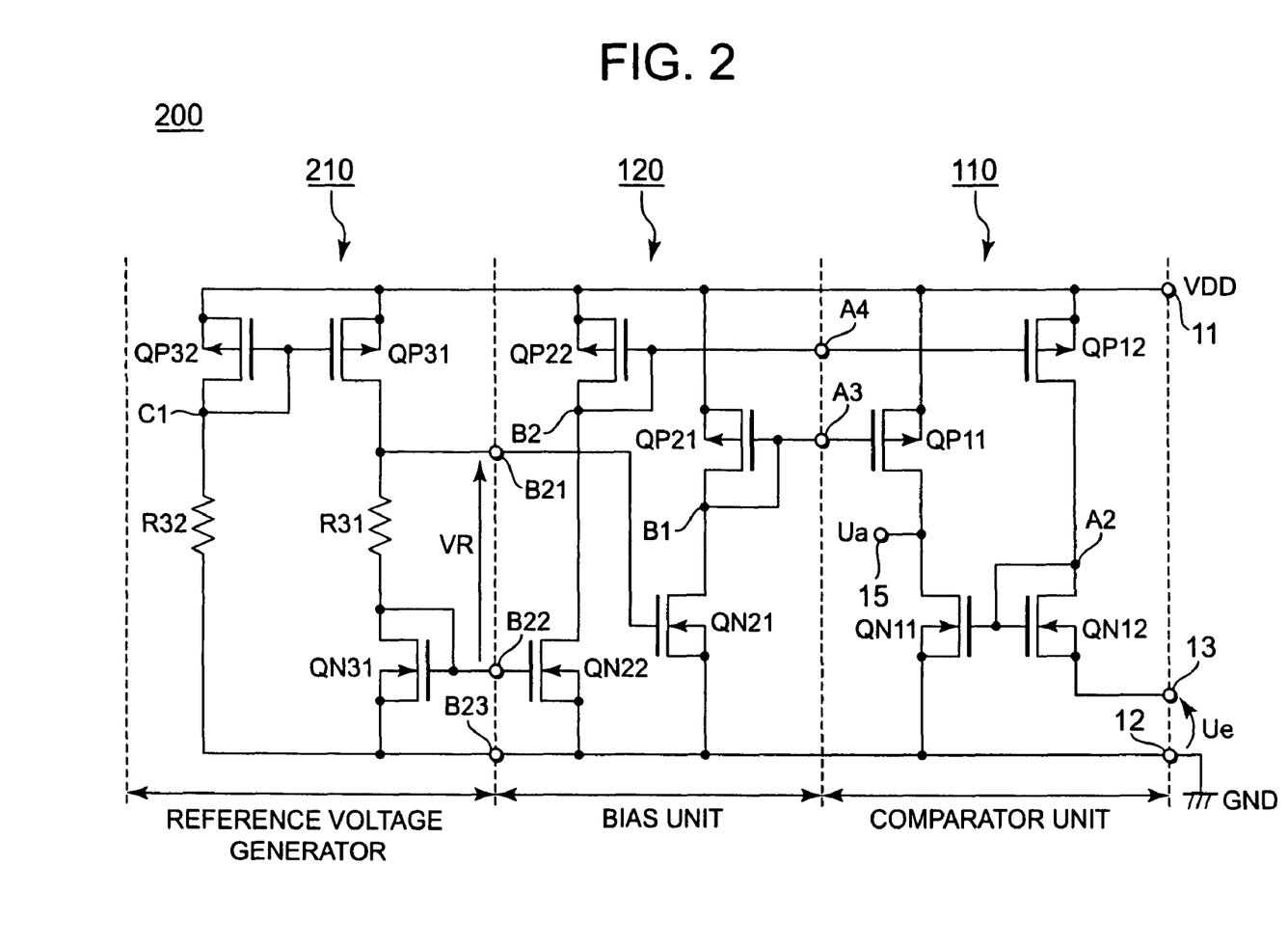
FIG. 2 is a diagram showing a configuration of a comparator circuit according to a second exemplary embodiment of the present invention.

FIG. 2 shows a configuration of a comparator circuit 200 according to a second exemplary embodiment. As shown in FIG. 2, the comparator circuit 200 includes the bias unit 120, the comparator unit 110, and a reference voltage generator 210.

Incidentally, of structural components designated by the reference characters shown in FIG. 2, those designated by the same reference characters in FIG. 1 indicate the same or similar structural components as or to those in FIG. 1. Since the bias unit 120 and the comparator unit 110 are the same as has been described in the first exemplary embodiment, description thereof will be omitted from discussion of the second exemplary embodiment. The comparator circuit 200 according to the second exemplary embodiment has a circuit configuration in which the reference voltage generator 230 is further added to the configuration of the first exemplary embodiment. With emphasis on that respect, therefore, description will be given for the second exemplary embodiment. Here, however, in the second exemplary embodiment, the terminals 21, 22 and 23 of the first exemplary embodiment are replaced by connection nodes B21, B22 and B23, respectively, which provide connections between the bias unit 120 and the reference voltage generator 210. The node B23 is connected to the terminal 12.

The reference voltage generator 210 generates the reference voltage VR described in the first exemplary embodiment, and feeds the reference voltage VR to the bias unit 120. The reference voltage generator 210 includes PMOS transistors QP31 and QP32, an NMOS transistor QN31, and resistors R31 and R32. The PMOS transistor QP31 (tenth transistor) is connected at its source to the terminal 11, at its drain to the node B21, and at its gate to a node C1. The PMOS transistor QP32 (ninth transistor) is connected at its source to the terminal 11, and at its drain and gate to the node C1. Here, the PMOS transistors QP31 and QP32 form a current mirror with the PMOS transistor QP32 acting as an input transistor.

The resistor R31 (second resistor) is connected at one terminal to the node B21, and at the other terminal to the node B22. The resistor R32 (first resistor) is connected at one terminal to the node C1, and at the other terminal to the node B23. Incidentally, for the sake of convenience, the reference characters "R31" and "R32" indicate resistor names and also represent the resistance values of the resistors. The NMOS transistor QN31 (eleventh transistor) is connected at its drain and gate to the node B22, and at its source to the node B23. Here, the NMOS transistor QN22 of the bias unit 120 and the NMOS transistor QN31 form a current mirror with the NMOS transistor QN31 acting as an input transistor.

Description will be given with regard to operation of the comparator circuit 200 configured as mentioned above. However, operation of the bias unit 120 and the comparator unit 110 is the same as has been described in the first exemplary embodiment. Therefore, description will be given below only with regard to operation of the reference voltage generator 210.

A current depending on the resistance value R32 passes through the PMOS transistor QP32. The PMOS transistor QP32 has a current mirror connection to the PMOS transistor QP31, and thus, the same current as the current passing through the PMOS transistor Q32 passes through the PMOS transistor Q31. This current causes a voltage drop in the resistor R31. The resistor R31 is connected at the one terminal to the node B21, and at the other terminal to the node B22. Thus, a voltage corresponding to the voltage drop in the resistor R31 is fed as the reference voltage VR to the bias unit 120. As mentioned above, the reference voltage VR generated by the reference voltage generator 210 can be determined by the operating voltage VDD, a gate-source voltage of the PMOS transistor QP32, and a resistance ratio between the resistors R31 and R32. Therefore, the reference voltage VR independent of the power supply voltage across the terminals 11 and 12 can be achieved by stabilization of the operating voltage VDD.

The PMOS transistors QP31 and QP32 have the same structure. At this time, the temperature characteristics of the PMOS transistors QP31 and QP32 can cancel each other. The reference voltage VR is determined by the resistance ratio between the resistors R31 and R32, and thus, resistors of the same type can be used as the resistors R31 and R32 so that the reference voltage VR may have high invulnerability to manufacturing tolerances.

(Third Exemplary Embodiment)

Figure 3:
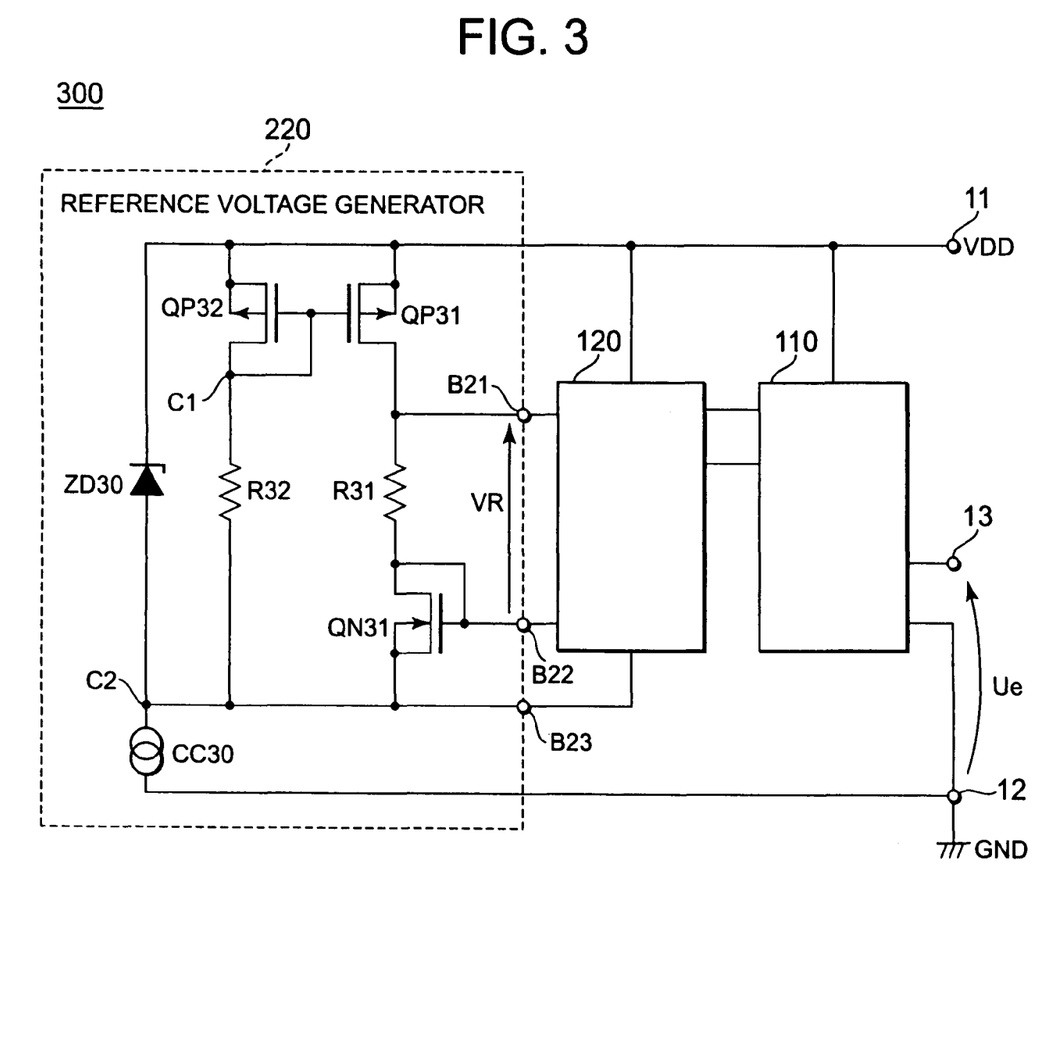
FIG. 3 is a diagram showing a configuration of a comparator circuit according to a third exemplary embodiment of the present invention.

FIG. 3 shows a configuration of a comparator circuit 300 according to a third exemplary embodiment. As shown in FIG. 3, the comparator circuit 300 includes the bias unit 120, the comparator unit 110, and a reference voltage generator 220.

The reference voltage generator 220 includes the PMOS transistors QP31 and QP32, the NMOS transistor QN31, the resistors R31 and R32, a Zener diode ZD30, and a constant-current source CC30. Incidentally, of structural components designated by the reference characters shown in FIG. 3, those designated by the same reference characters in FIG. 2 indicate the same or similar structural components as or to those in FIG. 2. The configuration of the comparator circuit 300 according to the third exemplary embodiment employs a circuit configuration in which a series circuit formed of the Zener diode ZD30 and the constant-current source CC30 is further added to the reference voltage generator 210 of the second exemplary embodiment. With emphasis on that respect, therefore, description will be given for the third exemplary embodiment. Also, since the bias unit 120 and the comparator unit 110 are the same as has been described in the first exemplary embodiment, description thereof will be omitted from discussion of the third exemplary embodiment.

The Zener diode ZD30 is connected at its cathode to the terminal 11, and at its anode to a node C2. The node C2 is connected to the node B23. Incidentally, in the second exemplary embodiment, the node B23 is connected to the terminal 12; however, in the third exemplary embodiment, the node B23 is not connected to the terminal 12. The constant-current source CC30 is connected between the node C2 and the ground terminal GND. Other structural components are the same as those of the reference voltage generator 210.

A breakdown voltage of the Zener diode ZD30 can apply a constant voltage across the terminal 11 that supplies the operating voltage VDD, and the node C2. The Zener diode having a breakdown voltage on the order of 6 V, in particular, is known to achieve the characteristics of being insensitive to temperature characteristics of the breakdown voltage and manufacturing tolerances, because of coexistence of a Zener breakdown and an avalanche breakdown. Thus, the comparator circuit 300 can utilize the Zener diode ZD30 to achieve the effect of having no influence on the reference voltage VR generated by the reference voltage generator 220, even if there are variations in the power supply voltage VDD as the operating voltage.

(Fourth Exemplary Embodiment)

Figure 4:
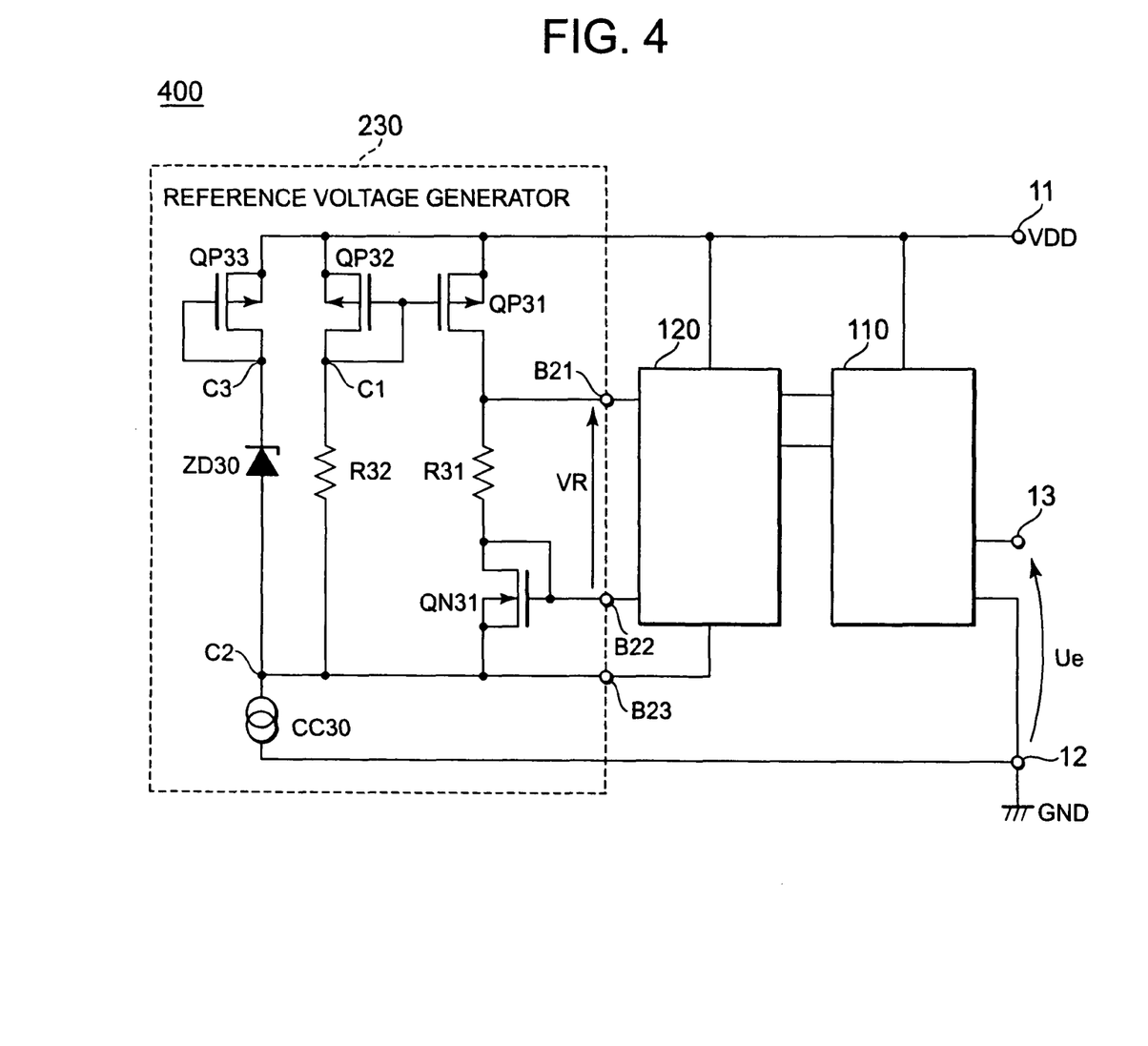
FIG. 4 is a diagram showing a configuration of a comparator circuit according to a fourth exemplary embodiment of the present invention.

FIG. 4 shows a configuration of a comparator circuit 400 according to a fourth exemplary embodiment. As shown in FIG. 4, the comparator circuit 400 includes the bias unit 120, the comparator unit 110, and a reference voltage generator 230.

The reference voltage generator 230 includes the PMOS transistors QP31 and QP32, a PMOS transistor QP33, the NMOS transistor QN31, the resistors R31 and R32, the Zener diode ZD30, and the constant-current source CC30. Incidentally, of structural components designated by the reference characters shown in FIG. 4, those designated by the same reference characters in FIG. 3 indicate the same or similar structural components as or to those in FIG. 3. The configuration of the comparator circuit 400 according to the fourth exemplary embodiment employs a circuit configuration in which the PMOS transistor QP33 is further added to the reference voltage generator 220 of the third exemplary embodiment. With emphasis on that respect, therefore, description will be given for the fourth exemplary embodiment.

The PMOS transistor QP33 (twelfth transistor) is connected at its source to the terminal 11, and at its drain and gate to a node C3. Then, the Zener diode ZD30 is connected at its cathode to the node C3, and at its anode to the node C2. Other structural components are the same as those of the reference voltage generator 220.

Here, in the second and third exemplary embodiments, the reference voltage VR can possibly be affected by manufacturing tolerances of a threshold voltage of the PMOS transistor QP32. However, the PMOS transistor QP33 cancels the gate-source voltage of the PMOS transistor QP32, and thus, the reference voltage generator 230 can generate the reference voltage VR insensitive to the manufacturing tolerances of the threshold voltage.

(Fifth Exemplary Embodiment)

Figure 5:
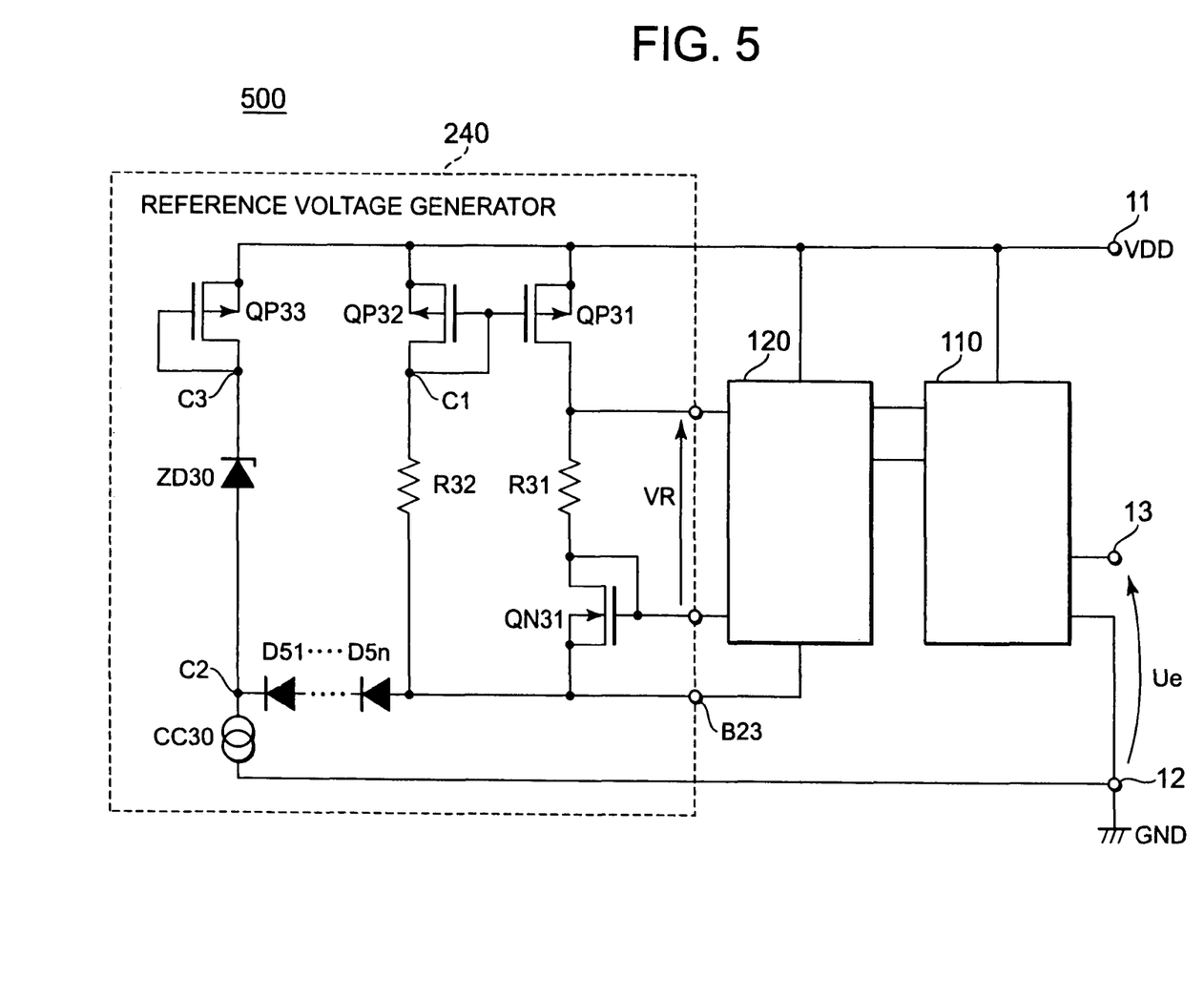
FIG. 5 is a diagram showing a configuration of a comparator circuit according to a fifth exemplary embodiment of the present invention.

FIG. 5 shows a configuration of a comparator circuit 500 according to a fifth exemplary embodiment. As shown in FIG. 5, the comparator circuit 500 includes the bias unit 120, the comparator unit 110, and a reference voltage generator 240.

The reference voltage generator 240 includes the PMOS transistors QP31, QP32 and QP33, the NMOS transistor QN31, the resistors R31 and R32, the Zener diode ZD30, the constant-current source CC30, and diodes D51 to D5n (n: a positive integer). Incidentally, of structural components designated by the reference characters shown in FIG. 5, those designated by the same reference characters in FIG. 4 indicate the same or similar structural components as or to those in FIG. 4. The configuration of the comparator circuit 500 according to the fifth exemplary embodiment employs a circuit configuration in which the diodes D51 to D5n are further added to the reference voltage generator 230 of the fourth exemplary embodiment. With emphasis on that respect, therefore, description will be given for the fifth exemplary embodiment.

The diodes D51 to D5n are connected in series in one and the same direction between the node C2 and the node B23. Of the series-connected diodes D51 to D5n, the diode D5n is connected at its anode to the node B23, and the diode D51 is connected at its cathode to the node C2. Other structural components are the same as those of the reference voltage generator 230.

The diodes D51 to D5n enable the reference voltage VR to have temperature dependence. The temperature dependence is set equal to temperature characteristics of the input signal Ue so that the detected value of the comparator circuit 500 becomes insensitive to temperature.

(Sixth Exemplary Embodiment)

Figure 6:
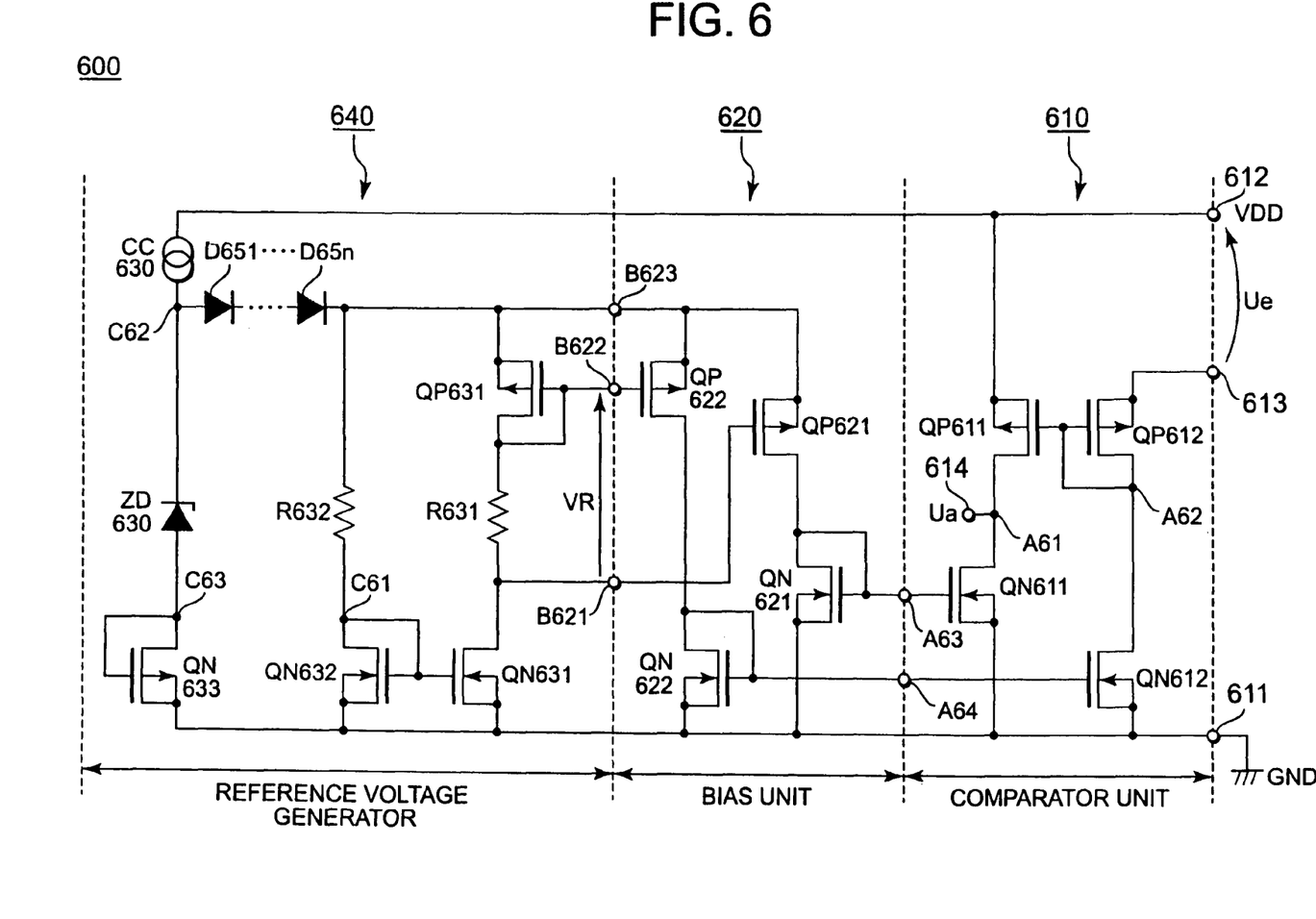
FIG. 6 is a diagram showing a configuration of a comparator circuit according to a sixth exemplary embodiment of the present invention.

FIG. 6 shows a configuration of a comparator circuit 600 according to a sixth exemplary embodiment. As shown in FIG. 6, the comparator circuit 600 includes a bias unit 610, a comparator unit 620, and a reference voltage generator 640.

The reference voltage generator 640 includes NMOS transistors QN631, QN632 and QN633, a PMOS transistor QP631, resistors R631 and R632, a Zener diode ZD630, a constant-current source CC630, and diodes D651 to D65n (n: a positive integer).

The NMOS transistor QN631 (tenth transistor) is connected at its source to a terminal 611, at its drain to a node B621, and at its gate to a node C61. The NMOS transistor QN632 (ninth transistor) is connected at its source to the terminal 611, and at its drain and gate to the node C61. Here, the NMOS transistors QN631 and QN632 form a current mirror with the NMOS transistor QN632 acting as an input transistor.

The resistor R631 (second resistor) is connected at one terminal to the node B621, and at the other terminal to a node B622. The resistor R632 (first resistor) is connected at one terminal to the node C61, and at the other terminal to a node B623. The PMOS transistor QP631 (eleventh transistor) is connected at its drain and gate to the node B622, and at its source to the node B623.

The NMOS transistor QN633 (twelfth transistor) is connected at its source to the terminal 611, and at its drain and gate to a node C63. The Zener diode ZD630 is connected at its cathode to a node C62, and at its anode to the node C63. The diodes D651 to D65n are connected in series in one and the same direction between the node C62 and the node B623. Of the series-connected diodes D651 to D65n, the diode D65n is connected at its cathode to the node B623, and the diode D651 is connected at its anode to the node C62. The constant-current source CC630 is connected between a terminal 612 and the node C62.

The bias unit 620 includes NMOS transistors QN621 and QN622, and PMOS transistors QP621 and QP622. The NMOS transistor QN621 (third transistor) is connected at its source to the terminal 611, and at its drain and gate to a node A63. The NMOS transistor QN622 (fourth transistor) is connected at its source to the terminal 611, and at its drain and gate to a node A64. The PMOS transistor QP621 (first transistor) is connected at its drain to the node A63, at its source to the node B623, and at its gate to the node B621 (first terminal). The PMOS transistor QP622 (second transistor) is connected at its drain to the node A64, at its source to the node B623, and at its gate to the node B622 (second terminal). Here, the nodes B621 and B622 act as connection nodes to provide connections between the bias unit 620 and the reference voltage generator 640. Further, the nodes B621 and B622 are applied with the reference voltage VR generated by the reference voltage generator 640. The PMOS transistors QP622 and QP631 form a current mirror with the PMOS transistor QP631 acting as an input transistor.

The comparator unit 610 includes NMOS transistors QN611 and QN612, and PMOS transistors QP611 and QP612.

The NMOS transistor QN611 (fifth transistor) is connected at its source to the terminal 611 (fifth terminal), at its drain to a node A61, and at its gate to the node A63. The NMOS transistor QN612 (sixth transistor) is connected at its source to the terminal 611, at its drain to a node A62, and at its gate to the node A64. The PMOS transistor QP611 (eighth transistor) is connected at its drain to the node A61, at its source to the terminal 612 (third terminal), and at its gate to the node A62. The PMOS transistor QP612 (seventh transistor) is connected at its drain and gate to the node A62, and at its source to a terminal 613 (fourth terminal). Here, the nodes A63 and A64 act as connection nodes to provide connections between the comparator unit 610 and the bias unit 620. The node A61 forms an output terminal 614 to output the output signal Ua. The terminal 611 is supplied with the ground voltage GND. The terminal 612 is supplied with the operating voltage VDD. A voltage across the terminals 612 and 611 acts as a power supply voltage of the comparator circuit 600. The operating voltage VDD supplied to the terminal 612 acts as a standard voltage of the comparator circuit 600. The target voltage Ue to be detected is inputted across the terminals 612 and 613.

The comparator circuit 600 as mentioned above is configured by reversing the conductivity type of the MOS transistors that form the structural components of the units of the comparator circuit 500. Further, the polarity of the voltage inputted to the terminals 612 and 611 that act as power supply terminals is also opposite to that of the comparator circuit 500. Thus, the comparator circuit 500 uses the ground voltage GND of the terminal 11 as the standard voltage, whereas the comparator circuit 600 uses the operating voltage VDD inputted to the terminal 612 as the standard voltage. Therefore, the principle of operation of the comparator circuit 600 is substantially the same as that of the comparator circuit 500, and thus, description thereof will be omitted.

Thereby, the same effects as those of the fifth exemplary embodiment can be achieved, even if the conductivity type of the MOS transistors that form the comparator circuit, and the polarity of the operating voltage are reversed, as is the case with the comparator circuit 600 according to the sixth exemplary embodiment.

Note that the present invention is not limited to the above exemplary embodiments and changes can be appropriately made without departing from the gist of the invention.

Further, it is noted that Applicant's intent is to encompass equivalents of all claim elements, even if amended later during prosecution.

What is claimed is:

1. A comparator circuit, comprising:
   first and second terminals to which a reference voltage that determines a threshold voltage is inputted;
   a third terminal to which a standard voltage is inputted;
   a fourth terminal to which a target voltage that is to be detected and is based on the standard voltage is inputted;
   first and second transistors of a first conductivity type including control terminals connected to the first and second terminals, respectively, the first and second transistors flowing currents depending on a potential difference of the reference voltage;
   a third transistor of a second conductivity type connected in series with the first transistor;
   a fourth transistor of the second conductivity type connected in series with the second transistor;
   a fifth transistor of the second conductivity type through which a mirror current flows depending on a current flowing through the third transistor;
   a sixth transistor of the second conductivity type flowing a mirror current depending on a current flowing through the fourth transistor;
   a seventh transistor of the first conductivity type connected between the sixth transistor and the fourth terminal; and
   an eighth transistor of the first conductivity type connected between the fifth transistor and the third terminal, the eighth transistor flowing a mirror current depending on a current passing through the seventh transistor,
   wherein a voltage depending on a voltage of an intermediate node between the fifth and eighth transistors is outputted as an output signal.

2. The comparator circuit according to claim 1, wherein the first to eighth transistors comprise MOS transistors, the first, second, seventh and eighth transistors have a same configuration, and the third, fourth, fifth and sixth transistors have a same configuration.

3. The comparator circuit according to claim 2, further comprising:
   a reference voltage generator circuit that supplies a potential difference between the first and second terminals which is equivalent to the reference voltage.

4. The comparator circuit according to claim 3, wherein:
   the reference voltage generator circuit includes first and second resistors of a same type, and generates the reference voltage by using a resistance ratio between the first and second resistors.

5. The comparator circuit according to claim 4, wherein: the reference voltage generator circuit includes ninth and tenth transistors of the second conductivity type; the ninth transistor is connected in series with the first resistor; the tenth transistor is connected in series with the second resistor, the tenth transistor flowing a mirror current depending on a current flowing through the ninth transistor; and voltages at both ends of the second resistor are used to generate the reference voltage.

6. The comparator circuit according to claim 5, wherein: the reference voltage generator circuit further includes an eleventh transistor of the first conductivity type; and the eleventh transistor has a gate and a drain connected to each other, and being connected in series with the second resistor.

7. The comparator circuit according to claim 6, wherein:
   the reference voltage generator circuit further includes a Zener diode; and
   the Zener diode is connected in parallel with a first series circuit and a second series circuit, the first series circuit comprising the ninth transistor and the first resistor, the second series circuit comprising the tenth transistor, the second resistor and the eleventh transistor.

8. The comparator circuit according to claim 6, wherein:
   the reference voltage generator circuit further includes a Zener diode, and a twelfth transistor of the second conductivity type having a gate and a drain connected to each other, and being connected in series with the Zener diode; and
   a third series circuit comprising the twelfth transistor and the Zener diode is connected in parallel with a first series circuit and a second series circuit, the first series circuit comprising the ninth transistor and the first resistor, the second series circuit comprising the tenth transistor, the second resistor and the eleventh transistor.

9. The comparator circuit according to claim 8, wherein:
   the third series circuit further includes n stages of diodes (n: a positive integer), a cathode terminal of the n stages of diodes is connected with an anode of the Zener diode and an anode terminal of the n stages of diodes is connected with the first resistor and the eleventh transistor.

10. The comparator circuit according to claim 1, wherein:
    the sixth and seventh transistors are connected in series between a fifth terminal and the fourth terminal;
    the fifth and eighth transistors are connected in series between the fifth terminal and the third terminal; and a higher voltage than the standard voltage inputted to the third terminal is applied to the fifth terminal.

11. The comparator circuit according to claim 10, wherein the standard voltage is a ground voltage.

12. The comparator circuit according to claim 1, wherein:
the sixth and seventh transistors are connected in series between a fifth terminal and the fourth terminal;
the fifth and eighth transistors are connected in series between the fifth terminal and the third terminal; and
a lower voltage than the standard voltage inputted to the third terminal is applied to the fifth terminal.

13. The comparator circuit according to claim 12, wherein the standard voltage is a power supply voltage.

14. A comparator circuit, comprising:
a first power source having a first potential;
a second power source having a second potential different from the first potential;
a first transistor of a first conductivity type coupled between the second power source and a first node, and including a control gate coupled to a first terminal;
a second transistor of the first conductivity type coupled between the second power source and a second node, and including a control gate coupled to a second terminal;
a first current mirror structure connected to the first node and a third node, and connected to the first power source;
a second current mirror structure connected to the second node and a fourth node, and connected to the first power source;
a third current mirror structure connected to the third and fourth nodes, and connected to the second power source and a third terminal; and
an output terminal coupled to the third node.

15. The comparator circuit as claimed in claim 14, further comprising a reference voltage generator including:
a fourth current mirror structure connected to the first power source, and connected to the first terminal;
a first resistor coupled between the fourth current mirror structure and the second power source;
a second resistor coupled between the first terminal and the second terminal; and
a third transistor of the first conductivity type coupled between the second terminal and the second power source, and including a control gate coupled to the second terminal.

16. The comparator circuit as claimed in claim 15, wherein the reference voltage generator includes a Zener diode coupled between the first and second power sources.

17. The comparator circuit as claimed in claim 16, wherein the reference voltage generator includes a fourth transistor coupled between the first power source and the Zener diode.

18. The comparator circuit as claimed in claim 17, wherein the reference voltage generator includes a series of diodes coupled between the Zener diode and the first resister.

* * * * *